US009153631B2

(12) United States Patent  
Sung et al.

(10) Patent No.: US 9,153,631 B2  
(45) Date of Patent: Oct. 6, 2015

(54) ORGANIC LIGHT EMITTING DIODE DISPLAY DEVICE

(71) Applicant: LG Display Co., Ltd., Seoul (KR)

(72) Inventors: Kiyoung Sung, Seoul (KR); Sangsoo Kim, Paju-si (KR); Sang-il Shin, Goyang-si (KR)

(73) Assignee: LG Display Co., Ltd., Seoul (KR)

( * ) Notice: Subject to any disclaimer, the term of this patent is extended or adjusted under 35 U.S.C. 154(b) by 0 days.

(21) Appl. No.: 14/310,243

(22) Filed: Jun. 20, 2014

(65) Prior Publication Data

US 2015/0001500 A1  Jan. 1, 2015

(30) Foreign Application Priority Data

Jun. 26, 2013  (KR) .......................... 10-2013-0073556

(51) Int. Cl.
*H01L 27/32* (2006.01)
*H01L 51/52* (2006.01)

(52) U.S. Cl.
CPC ........ *H01L 27/3244* (2013.01); *H01L 27/3276* (2013.01); *H01L 51/52* (2013.01); *H01L 51/5246* (2013.01)

(58) Field of Classification Search
CPC .. H01L 27/3244; H01L 27/3276; H01L 51/52
USPC ......... 257/40, 79, E27.117, E27.119, E27.12, 257/E51.022, E51.005
See application file for complete search history.

(56) References Cited

U.S. PATENT DOCUMENTS

| 6,525,704 | B1* | 2/2003 | Kondo et al. ................... 345/78 |
| 7,935,967 | B2* | 5/2011 | Takayama et al. .............. 257/59 |
| 2002/0153844 | A1* | 10/2002 | Koyama ..................... 315/169.3 |
| 2003/0094615 | A1* | 5/2003 | Yamazaki et al. .............. 257/72 |
| 2003/0127650 | A1* | 7/2003 | Park et al. ........................ 257/72 |
| 2003/0127652 | A1* | 7/2003 | Park et al. ........................ 257/72 |
| 2003/0197466 | A1* | 10/2003 | Yamazaki et al. ............ 313/504 |
| 2004/0012058 | A1* | 1/2004 | Aoki ............................ 257/414 |
| 2004/0027058 | A1* | 2/2004 | Park ............................. 313/504 |
| 2004/0129960 | A1* | 7/2004 | Maruyama et al. ........... 257/288 |
| 2005/0012097 | A1* | 1/2005 | Yamazaki ....................... 257/59 |
| 2005/0023956 | A1* | 2/2005 | Kwak et al. ................... 313/495 |
| 2005/0056840 | A1* | 3/2005 | Yamazaki et al. .............. 257/59 |
| 2005/0095874 | A1* | 5/2005 | Park et al. ..................... 438/800 |

(Continued)

FOREIGN PATENT DOCUMENTS

EP  2 105 964 A1  9/2009
EP  2 413 363 A2  2/2012

OTHER PUBLICATIONS

European Patent Office, Search Report and Opinion, European Patent Application No. 14173846.8, Dec. 4, 2014, eight pages.

*Primary Examiner* — Michele Fan
(74) *Attorney, Agent, or Firm* — Fenwick & West LLP (57) ABSTRACT

The present invention provides an organic light emitting diode display device comprising a substrate comprising a display region and a non-display region, a thin film transistor formed in the display region; an organic light emitting layer connected to the thin film transistor, a bank formed to define a light emitting region of the organic light emitting layer, a metal pattern disposed in the non-display region and not covered with the bank; and a conductive pattern connected to the organic light emitting layer while covering the metal pattern and partially physically separated on the metal pattern.

20 Claims, 10 Drawing Sheets

(56) References Cited

U.S. PATENT DOCUMENTS

| | | | |
|---|---|---|---|
| 2005/0140279 A1* | 6/2005 | Park ................................ 313/504 |
| 2005/0206309 A1* | 9/2005 | Shibasaki et al. ............. 313/504 |
| 2006/0060850 A1* | 3/2006 | Kwak et al. ..................... 257/59 |
| 2006/0065812 A1* | 3/2006 | Kitazawa ................... 250/208.1 |
| 2006/0113900 A1* | 6/2006 | Oh ................................ 313/504 |
| 2006/0125390 A1* | 6/2006 | Oh ................................ 313/506 |
| 2006/0158398 A1* | 7/2006 | Akimoto et al. ................ 345/77 |
| 2007/0024181 A1* | 2/2007 | Oh ................................ 313/500 |
| 2008/0191603 A1* | 8/2008 | Kubota ........................ 313/498 |
| 2008/0197778 A1* | 8/2008 | Kubota ........................... 315/73 |
| 2009/0009069 A1* | 1/2009 | Takata .......................... 313/504 |
| 2009/0045733 A1* | 2/2009 | Suh et al. ..................... 313/504 |
| 2009/0130786 A1* | 5/2009 | Park ................................. 438/22 |
| 2009/0153046 A1* | 6/2009 | Hayashi et al. ............... 313/505 |
| 2009/0244423 A1* | 10/2009 | Hirakata et al. ............... 349/46 |
| 2009/0261720 A1* | 10/2009 | Shinto ........................... 313/504 |
| 2009/0298377 A1* | 12/2009 | Yamazaki et al. .............. 445/52 |
| 2010/0053144 A1* | 3/2010 | Akimoto et al. ............. 345/213 |
| 2010/0127273 A1* | 5/2010 | Kim ................................ 257/72 |
| 2010/0213482 A1* | 8/2010 | Kim et al. ....................... 257/98 |
| 2011/0006302 A1* | 1/2011 | Yamazaki et al. .............. 257/43 |
| 2011/0063267 A1* | 3/2011 | Sim et al. ...................... 345/205 |
| 2011/0220898 A1* | 9/2011 | Yoon et al. ...................... 257/59 |
| 2011/0254757 A1* | 10/2011 | Kim ................................ 345/76 |
| 2012/0025700 A1* | 2/2012 | Ryu et al. ...................... 313/512 |
| 2012/0080664 A1 | 4/2012 | Kim et al. |
| 2012/0162053 A1 | 6/2012 | Lee et al. |
| 2012/0205671 A1* | 8/2012 | Yamazaki et al. .............. 257/79 |
| 2013/0048964 A1* | 2/2013 | Takeda et al. ................... 257/40 |
| 2013/0049003 A1* | 2/2013 | Choi et al. ...................... 257/72 |
| 2013/0049062 A1* | 2/2013 | Hatano et al. ................... 257/99 |
| 2013/0187187 A1* | 7/2013 | Matsukura .................... 257/99 |
| 2014/0061604 A1* | 3/2014 | Seo et al. ........................ 257/40 |
| 2014/0124769 A1* | 5/2014 | Kang et al. ..................... 257/40 |
| 2014/0145164 A1* | 5/2014 | Odaka et al. ................... 257/40 |
| 2014/0159002 A1* | 6/2014 | Lee et al. ........................ 257/40 |
| 2014/0166996 A1* | 6/2014 | Kim ................................ 257/40 |
| 2014/0203307 A1* | 7/2014 | Su et al. .......................... 257/88 |
| 2014/0225071 A1* | 8/2014 | Park et al. ....................... 257/40 |
| 2014/0353609 A1* | 12/2014 | Song ............................... 257/40 |
| 2014/0353616 A1* | 12/2014 | Park et al. ....................... 257/40 |

* cited by examiner

FIG. 1

[Prior Art]

FIG. 2

[Prior Art]

FIG. 3

[Prior Art]

ORGANIC LIGHT EMITTING DIODE DISPLAY DEVICE

This application claims the priority benefit of Korea Patent Application No. 10-2013-0073556 filed on Jun. 26, 2013, which is incorporated herein by reference for all purposes as if fully set forth herein.

BACKGROUND

1. Field of the Art

This document relates to an organic light emitting diode display device, and more particularly, to an organic light emitting diode display device which has a structure devised to overcome defects that might occur during the process of simplifying the manufacture of the organic light emitting diode display device.

2. Discussion of the Related Art

In recent years, various types of flat panel displays having reduced weight and volume, which are drawbacks of cathode ray tubes (CTRs), have been developed. These flat panel displays comprise liquid crystal displays (LCDs), field emission displays (FEDs), plasma display panels (PDPs), and electroluminescence devices (ELs).

Figure 1:
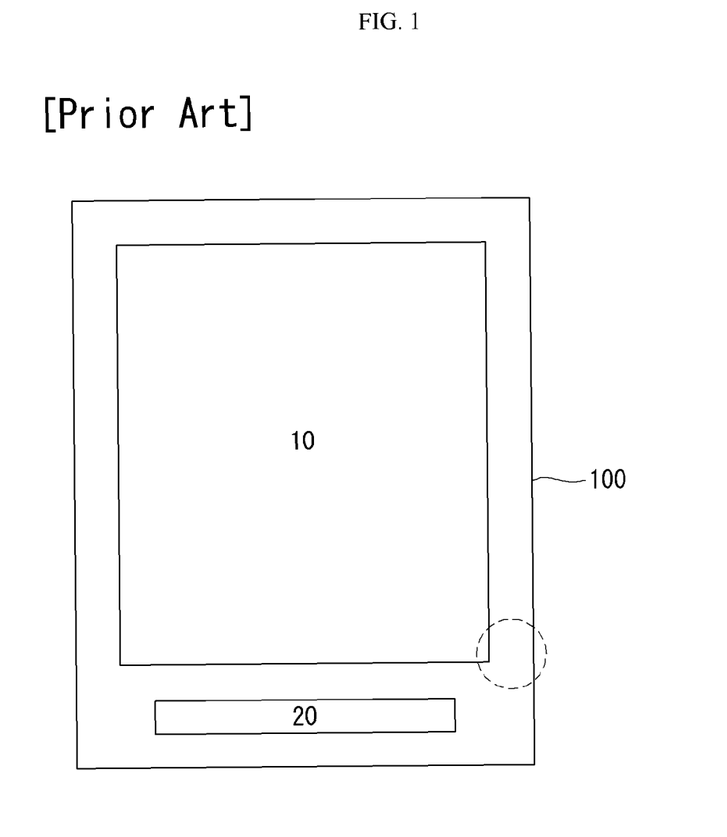
FIG. 1 is a top plan view an organic light emitting diode display device according to the prior art.
Figure 2:
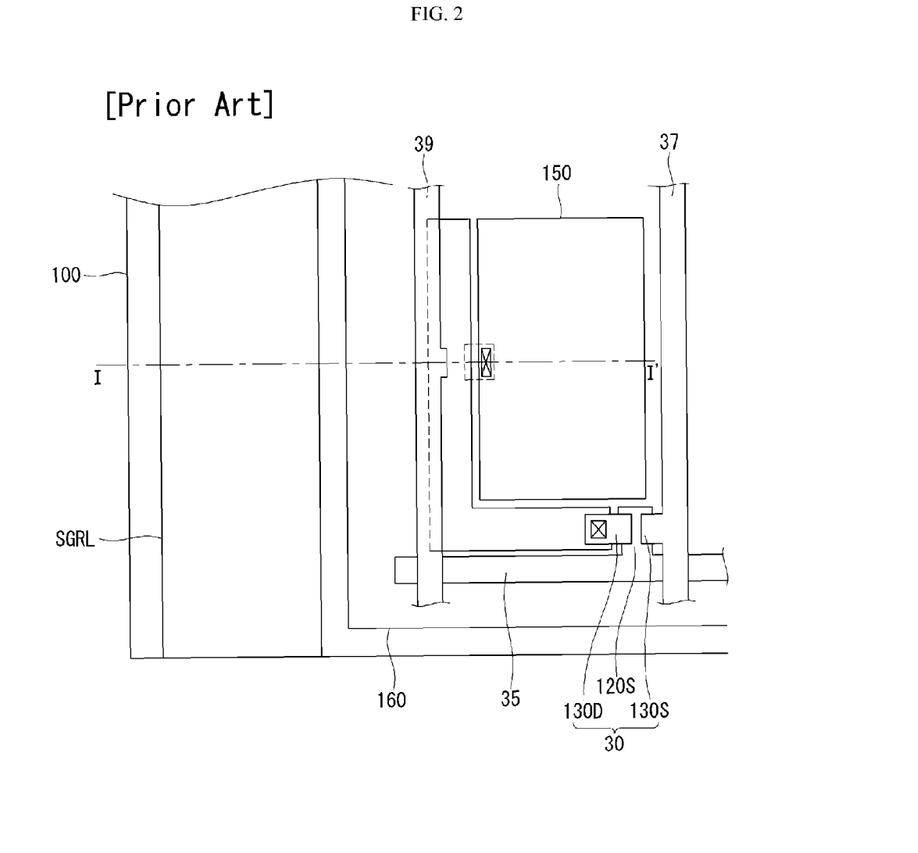
FIG. 2 is an enlarged view of area A of FIG. 1.
Figure 3:
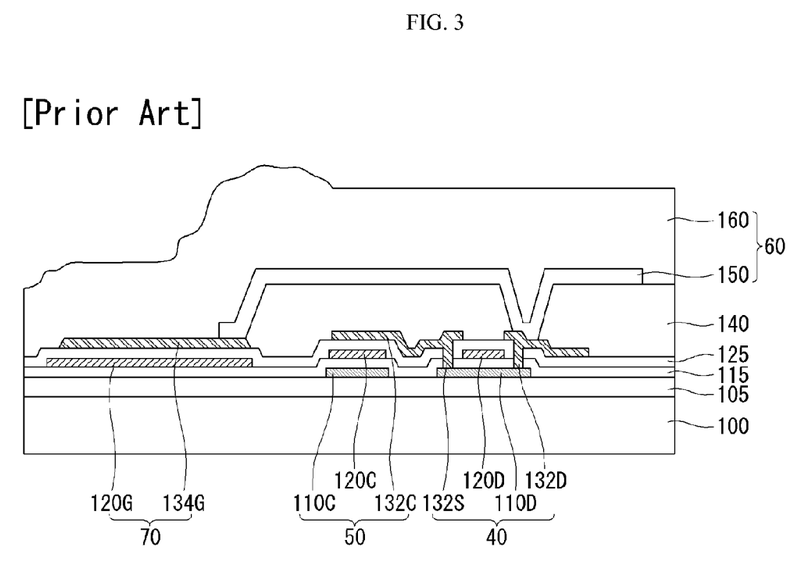
FIG. 3 is a cross-sectional view taken along the line I-I' of FIG. 2.
Figure 4:
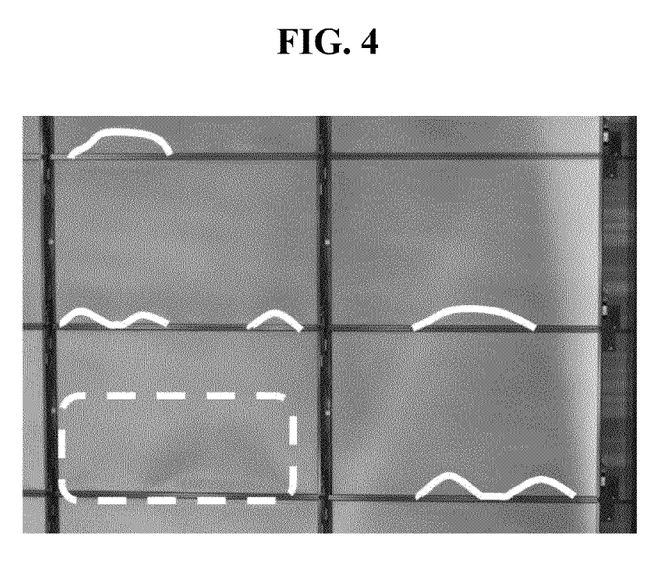
FIG. 4 is a photograph showing coating blotches on a bank layer.

FIG. 1 is a top plan view showing the structure of an organic light emitting diode display device (OLED) using a thin film transistor (TFT) as an active element according to the prior art. FIG. 2 is an enlarged view of area A of FIG. 1. FIG. 3 is a cross-sectional view showing the structure of the organic light emitting diode display device according to the prior art taken along the line I-I' of FIG. 2. FIG. 4 is a photograph showing coating blotches on a bank layer.

Referring to FIGS. 1 to 3, the organic light emitting diode display device comprises an active area 10 where an image is displayed on a substrate 100 and a driver 20 for applying driving signals to the active area 10. More specifically, the organic light emitting diode display device comprises a driving thin film transistor (hereinafter, referred to as 'driving TFT') 40, an organic light emitting diode 60 driven in connection with the driving TFT 40, and a sealing member (not shown) for sealing the substrate 100. The substrate 100 comprises a switching thin film transistor (hereinafter, referred to as 'switching TFT) 30, the driving TFT 40, a capacitor 50 connected to the driving TFT 40, and an organic light emitting diode connected to the driving TFT 40.

To manufacture the organic light emitting diode display device, a buffer layer 105 is formed on a glass substrate 100, and a switching TFT 30 is formed at a crossing portion of a gate line 35 and a data line 37. The switching TFT 30 comprises a gate electrode 120S branched from the gate line 35, a semiconductor layer (not shown), a source electrode 130S, and a drain electrode 130D. The driving TFT 40 comprises a gate electrode 120D connected to the drain electrode 130D of the switching TFT 30, a semiconductor layer 110D, a source electrode 132S connected to a driving current line 39, and a drain electrode 132D. The drain electrode 132D of the driving TFT 40 is connected to an anode 150 of the organic light emitting diode 60.

The semiconductor layer 110D of the driving TFT 40 and a capacitor lower electrode 110C are formed on the substrate 100. On a gate insulating film 115 overlying the semiconductor layer 110D and the capacitor lower electrode 110C, the gate electrode 120D is formed to overlap the center of the semiconductor layer 110D and a capacitor intermediate electrode 120C is formed to overlap the capacitor lower electrode 110C. The source electrode 132S and the drain electrode 132D are connected to both sides of the semiconductor layer 110D through contact holes. The source electrode 132S and the drain electrode 132D are formed on an interlayer insulating film 125 covering the gate electrode 120D, and the source electrode 132S is connected to a capacitor upper electrode 132C.

A ground line 70 to be connected to a cathode (not shown) of the organic light emitting diode 60 is formed on the outer periphery of the active area 10. The ground line 70 has a gate ground line 120G formed on the gate insulating film 115 and a source ground line 134G formed on the interlayer insulating film 125 and connected to the gate ground line 120G. A planarization film 140 is applied on a display region of the substrate 100. The planarization film 140 is patterned to form contact holes that expose the drain electrode 132D of the driving TFT 40. The anode 150 is formed on the planarization film 140 to come into contact with the drain electrode 132D of the driving TFT 40 through a contact hole.

A bank layer 160 is formed across the entirety of the substrate 100 everywhere except in a light emitting region. This means that during this stage of the manufacturing process, the bank layer 160 is initially deposited on top of the ground line 70. The bank layer 160 is then patterned by removing portions of the initially deposited bank layer 160 (not shown in FIG. 3). Subsequent to the patterning of the bank layer, a light emitting layer (not shown) is formed on the anode 150, and a cathode (not shown) is then formed to cover the remaining portion of the bank layer on top of the light emitting layer 155.

However, a problem arises from depositing and then removing/patterning the bank layer 160 in this way. Removal of all of a given section of the bank layer 160 is not always a completely successful process, and often some amount of bank layer 160 will remain after removal. For example during the removal, any bank layer 160 that was initially present on top of the ground line 70 is ideally removed during the bank removal/patterning process. However, often some amount of bank layer 160 will be left over on the surface of the ground line 70.

Often, the material used to make the bank layer 160, for example polyimide, has poor interface characteristics with metal layer made out of molybdenum-titanium (MoTi) or copper (Cu), an example of which is ground line 70. Poor interface characteristics include the inability to form a strong bond with adjacent materials. For example, polyamide cannot strongly bond with MoTi or Cu. As a result, when the bank layer 160 is initially formed and then removed from the ground line 70, leftover bank layer that was not able to be removed during the removal process will result in poor interface characteristics between the ground line 70 and whatever layer is later formed on the ground line 70. For example, if the cathode (not shown) is later formed on the ground line 70, intervening leftover bank layer can result in a poor interface with the cathode. FIG. 4 illustrates an example of incomplete bank layer removal. The leftover bank layer appears in FIG. 4 as irregularities in the thickness of the bank layer or as blotches.

Consequently, the leftover bank layer in between the ground line 70 and the cathode can result in a poor bond between these two layers. As a result, the two layers may separate over time, and create a path for moisture to penetrate into the display region of the device. Over time, this may negatively affect the performance of the organic light emitting diode display device. The leftover bank layer may also create visible blotches in the display region, which is highly undesirable.

SUMMARY

An aspect of this document is to provide an organic light emitting diode display device which offers high display quality and high reliability by preventing the generation of blotches in a display region and blocking the path through which moisture from the outside permeates into a light emitting layer.

To achieve the above advantages, one exemplary embodiment provides an organic light emitting diode display device comprising: a substrate comprising a display region and a non-display region; a thin film transistor formed in the display region; an organic light emitting layer connected to the thin film transistor; a bank formed to define a light emitting region of the organic light emitting layer; a metal pattern disposed in the non-display region and not covered with the bank; a first conductive pattern connected to the organic light emitting layer that is also connected to the metal pattern; and a second conductive pattern connected to the metal pattern that is physically separated from the first conductive pattern. According to this aspect, the organic light emitting diode display device solves the problem of degradation in adhesion force caused by the initial deposition and removal of the bank layer on the metal pattern, as the first and second conductive patterns are formed prior to the bank layer.

The metal pattern is a ground line that is formed in the non-display region along the outer periphery of the display region. The organic light emitting diode display device further comprises: an anode formed under the organic light emitting layer; and a cathode formed above the organic light emitting layer. The metal pattern comprises: a first metal pattern made of a gate metal comprising a gate electrode of the thin film transistor; and a second metal pattern made of a source metal comprising a source electrode of the thin film transistor. According to this aspect, part of the ground line of the organic light emitting diode display may be formed in the formation of a gate line and in the formation of a data line, respectively, without an additional mask process.

The first metal pattern and the second metal pattern are electrically connected to each other. According to this aspect, the ground line may be connected in parallel so that conductivity enhancement and a decrease in the width of the ground line formed per unit area can be achieved, contributing to reducing the bezel.

According to this aspect, the first and second conductive patterns function to prevent moisture or oxide components from permeating into the organic light emitting layer. In the case of moisture permeation through the first conductive pattern from the outside, the separation between the first and second conductive patterns prevents the moisture from further permeating into the second conductive pattern.

The conductive patterns are made of the same material layer as the anode and has the same stack structure as the anode. According to this aspect, the conductive patterns may be formed simultaneously with the anode using the same material in the same mask process, so no additional mask process is required.

The second conductive pattern may comprise a plurality of parts physically separated from each other. The plurality of parts may be in the shape of islands or stripes. The second conductive pattern may comprise a plurality of openings that expose the metal pattern.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention. In the drawings.

DETAILED DESCRIPTION OF THE EMBODIMENTS

Reference will now be made in detail to embodiments of the invention, examples of which are illustrated in the accompanying drawings. Wherever possible, the same reference numbers will be used throughout the drawings to refer to the same or like parts. It will be paid attention that detailed description of known arts will be omitted if it is determined that the arts can mislead the embodiments of the invention.

Figure 5:
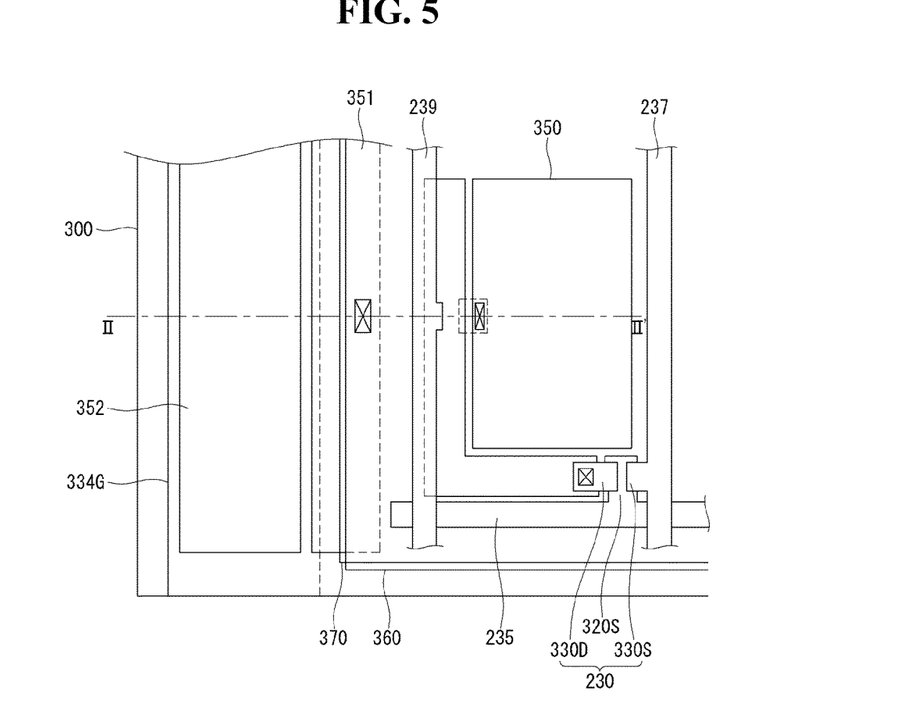
FIG. 5 is a top plan view showing an organic light emitting diode display device according to the present invention.
Figure 6:
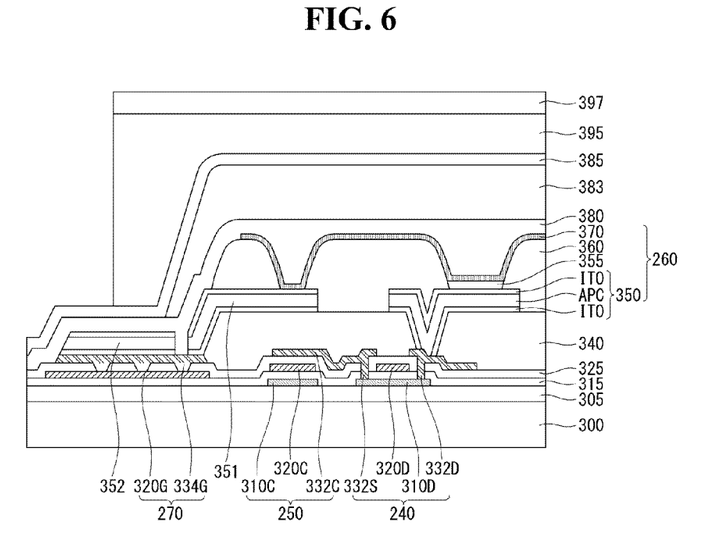
FIG. 6 is a cross-sectional view taken along the line II-II' of FIG. 5.
Figure 7A:
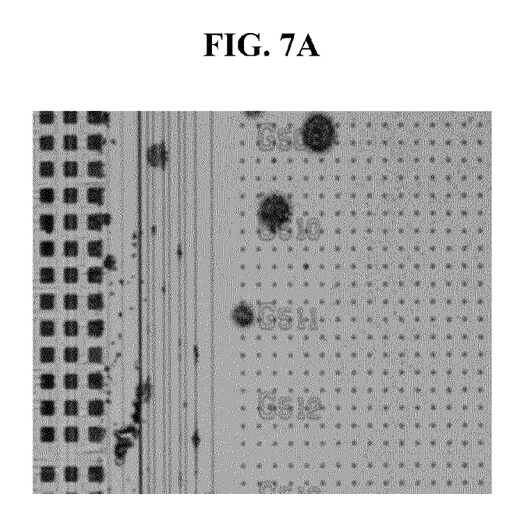
FIGS. 7a and 7b are photographs showing APC corrosion of a conductive pattern.
Figure 7B:
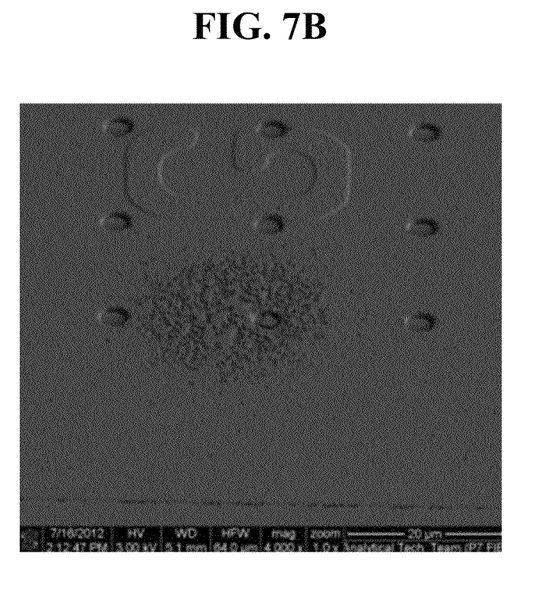

Hereinafter, an organic light emitting diode display device according to an exemplary embodiment will be described with reference to FIGS. 5 to 7b. FIG. 5 is a top plan view showing the structure of an organic light emitting diode display device using a thin film transistor as an active element according to the present invention. FIG. 6 is a cross-sectional view taken along the line II-II' of FIG. 5. FIGS. 7a and 7b are photographs showing APC corrosion of a conductive pattern.

Referring to FIGS. 5 and 6, the organic light emitting diode display according to the exemplary embodiment comprises a substrate 300 where switching and driving TFTs 230 and 240 and an organic light emitting diode 260 driven in connection with the driving TFT 240 are formed and a barrier film 397 attached above the substrate 300, with a sealing material 395 interposed between them. The substrate 300 comprises the switching TFT 230, the driving TFT 240 connected to a capacitor 250, the organic light emitting diode 260 connected to the driving TFT 240.

The switching TFT 230 is formed at a crossing portion of a gate line 235 and a data line 237 on the glass substrate 300. The switching TFT 230 functions to select pixels. The switching TFT 230 comprises a gate electrode 320S branched from the gate line 235, a semiconductor layer (not shown), a source electrode 330S, and a drain electrode 330D. The driving TFT 240 serves to drive the anode 350 of a pixel selected by the switching TFT 230. The driving TFT 240 comprises a gate electrode 320D connected to the drain 330D of the switching TFT 230, a semiconductor layer 310D, a source electrode 332S connected to a driving current line 239, and a drain electrode 332D. The drain electrode 332D of the driving TFT 240 is connected to the anode 350 of the organic light emitting diode 260.

FIG. 6 illustrates a thin film transistor having a top gate structure as an example. In this case, the semiconductor layer 310D and capacitor lower electrode 310C of the driving TFT 240 are formed on the substrate 300. The semiconductor layer 310D and the capacitor lower electrode 310C may be made of an amorphous silicon layer, a polycrystalline silicon layer obtained by crystallizing the amorphous silicon layer, or oxide semiconductor formed of a metal oxide.

A gate insulating film 315 is positioned on the semiconductor layer 310D and the capacitor lower electrode 310C. The gate insulating film 315 may be made of silicon oxide (SiOx), silicon nitride (SiNx), or a stack thereof. On the gate insulating film 315, the gate electrode 320D is formed to overlap the center of the semiconductor layer 310D and a capacitor intermediate electrode 320C is formed to overlap the capacitor lower electrode 310C. The gate electrode 320D and the capacitor intermediate electrode 320C may be formed of a single layer made of aluminum (Al), molybdenum (Mo), tungsten (W), titanium (Ti), or an alloy thereof or a multi-layer made of molybdenum/aluminum/molybdenum (Mo/Al/Mo) or titanium/aluminum/titanium (Ti/Al/Ti). The source electrode 332S and the drain electrode 332D are connected to both sides of the semiconductor layer 310D through contact holes.

The source electrode 332S and the drain electrode 332D are formed on an interlayer insulating film 325 covering the gate electrode 320D, and the source electrode 332S is connected to a capacitor upper electrode 332C. The interlayer insulating film 325 may be made of silicon oxide (SiOx), silicon nitride (SiNx), or a stack thereof. The source electrode 332S, the drain electrode 332D, and the capacitor upper electrode 332C may be formed of a single layer made of aluminum (Al), molybdenum (Mo), tungsten (W), titanium (Ti), or an alloy thereof or a multi-layer made of molybdenum/aluminum/molybdenum (Mo/Al/Mo) or titanium/aluminum/titanium (Ti/Al/Ti).

A ground line 270 to be connected to a cathode 370 of the organic light emitting diode 260 is formed on the outer periphery of an active area in the non-display region. The ground line 270 has a gate ground line 320G formed on the gate insulating film 315 and a source ground line 334G formed on the interlayer insulating film 325 and connected to the gate ground line 320G. The gate ground line 320G is made of the same material as the gate electrode 320D, and the source ground line 334G is made of the same material as the source electrode 332S.

A planarization film 340 is applied on a display region on the substrate 300. The planarization film 340 functions to make the roughness of the substrate surface even in order to apply an organic material constituting the organic light emitting diode 260 after making it smooth and planar. The planarization film 340 may be made of an organic substance such as polyimide, benzocyclobutene resin, or acrylate. The planarization film 340 is patterned to form contact holes that expose the drain electrode 332D of the driving TFT 240. The planarization film 340 is also patterned to fully expose the ground line 270.

The anode 350 is formed on the planarization film 340 to come into contact with the drain electrode 332D of the driving TFT 240 through a contact hole. A first conductive pattern 351 is formed on the planarization film 340 to bring one end into contact with the cathode 370 and the other end into contact with the ground line 334G. A second conductive pattern 352 is formed on the outer periphery in the non-display region, i.e., the source ground line 334G, of the display region where the planarization film 340 is not formed. At this time, the second conductive pattern 352 covers most of the source ground line 334G. However, the second conductive pattern 352 is spaced apart from the first conductive pattern 351 without being in physical contact with the above-mentioned first conductive pattern 351.

More specifically, the second conductive pattern 352 is spaced apart from the first conductive pattern 351. This is because the conductive patterns 351 and 352 are simultaneously formed in the same process as the anode 350 and the upper and lower layers of the anode 350 are made of ITO (Indium Tin Oxide) and its intermediate layer is made of a silver alloy layer (APC) containing 98% silver (Ag). Here, the silver alloy layer (APC) consists of a reflective layer containing silver (Ag) with high reflectivity so that the anode 350 acts as a reflective electrode.

Referring to FIGS. 7a and 7b, the silver alloy layer APC in a conductive pattern having an ITO/APC/ITO structure is corroded because of its vulnerability to moisture, and this causes the conductive pattern extended to the display region due to moisture permeation and act as the path of moisture permeation, thereby leading to reliability degradation. Accordingly, the path of moisture permeation is blocked by physically separating the conductive pattern acting as the path of moisture permeation into a first conductive pattern 351 and a second conductive pattern 352. The first conductive pattern 351 is brought into contact with the cathode 370 on the planarization layer 340 and connected to the source ground line 334G. The second conductive pattern 352 is spaced apart from the first conductive pattern 351 and covers most of the source ground line 334G. Therefore, even if the second conductive pattern 242 on the outermost part is partially corroded and moisture permeates into it, the path of moisture permeation can be blocked because the second conductive pattern 352 is physically separated from the first conductive pattern 351. The first conductive pattern 351 and the second conductive pattern 352 can be separated from each other on the ground line. On the other hand, the first conductive pattern 351 and the second conductive pattern 352 may be physically separated from each other in a certain area between the outside of the substrate and the organic emitting layer, in order to prevent moisture or the like from the outside from permeating into the organic emitting layer through the conductive pattern.

Also, the second conductive pattern 352 covers most of the source ground area 334G. A bank layer 360 is formed after the source ground line 334G is formed, and after the first 351 and second 352 conductive patterns are formed. The bank layer 360 is removed to expose the ground line 270 positioned on the outer periphery of the substrate 300. Moreover, the bank layer 360 is not exposed outside the substrate 300 and therefore does not act as the path of permeation of moisture and oxygen from the outside.

The interface characteristics between polyimide PI of the bank layer 360 and the source ground line 334G made of metal are poor, and as introduced above incomplete removal or patterning of un-needed portions of the bank layer may result in defects, gaps, and/or blotches. In the present invention, the second conductive pattern 352 comprising polyimide and ITO has good interfacial characteristics (e.g., forms a strong bond with) the source ground line 334G. Accordingly, the second conductive pattern 352 helps to minimize the area of contact with polyimide and prevent defects such as the formation of gaps or blotches on the source ground line 334G.

As illustrated in FIG. 5, the second conductive pattern 352 may be basically in the shape of a single integral-type bar as it is spaced apart from the first conductive pattern 351. Various shapes of the second conductive pattern 352 will now be described.

Figure 8:
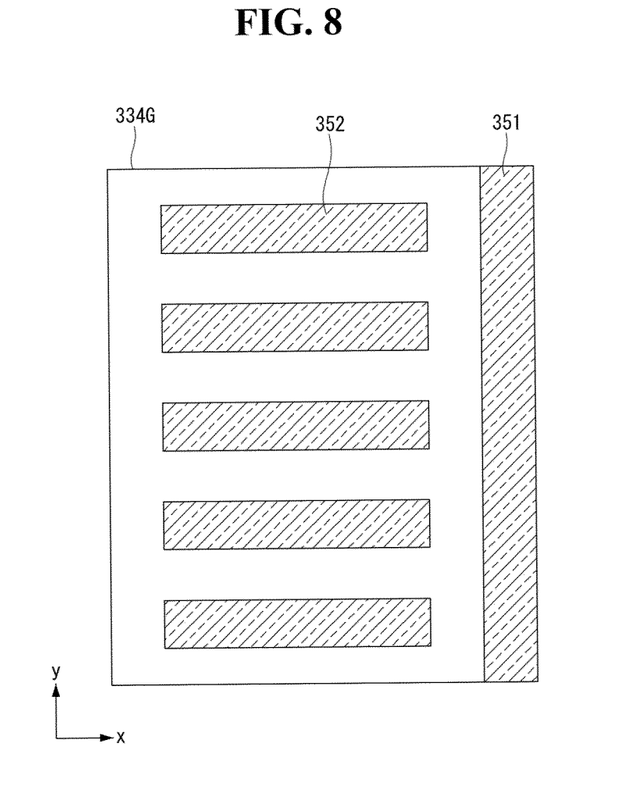
FIGS. 8 to 10 are top plan views of the ground line 270 of FIG. 6 as viewed from the top, according to several different embodiments.
Figure 9:
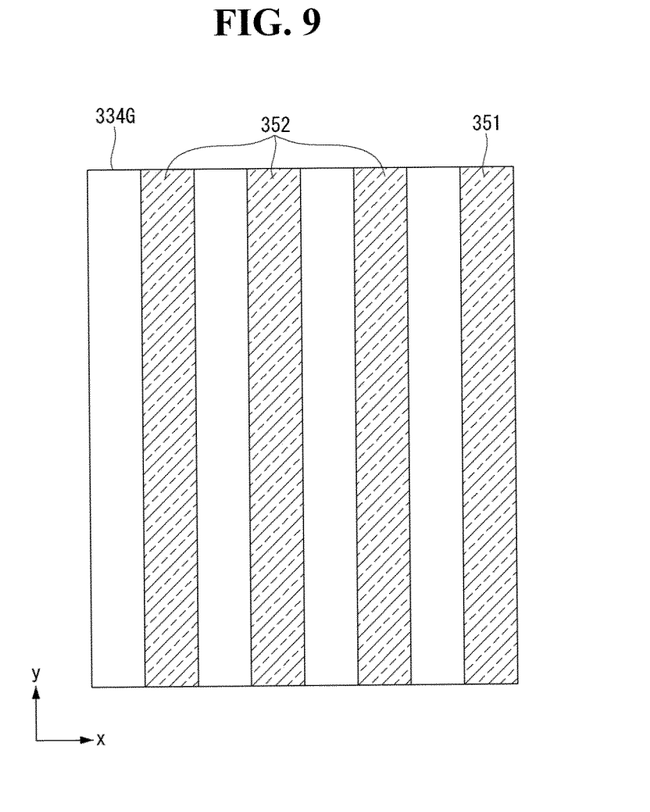
Figure 10:
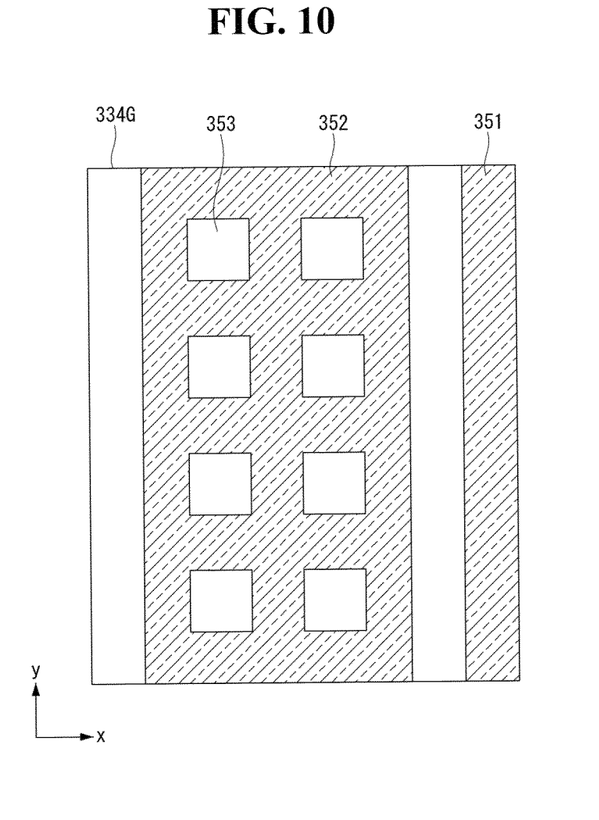

FIGS. 8 to 10 are top plan views of the ground line 270 of FIG. 6 as viewed from the top, according to several different embodiments.

Referring to FIG. 8, the second conductive pattern 352 may consist of a plurality of island patterns on the source ground line 334G. Each island patterns of the second conductive pattern 352 has a striped shape whose length is on the x axis and whose width is on the y axis. The second conductive pattern 352 should be of the maximum length possible on the source ground line 334G while still being spaced apart from the first conductive pattern 351. Also, the second conductive pattern 352 should be of the maximum width possible in such a way that the second conductive pattern 352 is spaced apart at least from other neighboring island patterns of the second conductive pattern 352. Accordingly, the second conductive pattern 352 reduces the area of contact between the source ground line 334G and polyimide, thereby preventing defects in the bank layer.

Referring to FIG. 9, the second conductive pattern 352 may consist of a plurality of island patterns on the source ground line 334G. Each island patterns of the second conductive pattern 352 has a striped shape whose length is on the x axis and whose width is on the y axis. The second conductive pattern 352 should be as long as the ground line 334G, but the present invention is not limited thereto and the second conductive pattern 352 may be divided into multiple parts within the length of the source ground line 334G. Also, the second conductive pattern 352 should be of the maximum width possible in such a way that the second conductive pattern 352 is spaced apart at least from other neighboring island patterns of the second conductive pattern 352 and spaced apart from the first conductive pattern 351. Although the figure illustrates that the second conductive pattern 352 has three island patterns, the second conductive pattern 352 may have several tens or hundreds of island patterns. Accordingly, the second conductive pattern 352 minimizes the area of contact between the source ground line 334G and polyimide, thereby preventing defects in the bank layer.

Referring to FIG. 10, the second conductive pattern 352 may comprise a plurality of openings 353 on the source ground line 334G. The second conductive pattern 352 has a bar shape whose width is on the x axis and whose length is on the y axis. The second conductive pattern 352 should be as long as the ground line 334G, but the present invention is not limited thereto and the second conductive pattern 352 may be divided into multiple parts within the length of the source ground line 334G. Also, the second conductive pattern 352 should be of the maximum width possible in such a way that the second conductive pattern 352 is spaced apart from the first conductive pattern 351. Although the figure illustrates that the second conductive pattern 352 is in the shape of a single bar, the present invention is not limited thereto and the second conductive pattern 352 may be in the shape of a plurality of bars and comprise a plurality of openings 353. Moreover, the number of the plurality of bars 353 may vary depending on the length or width of the second conductive pattern 352.

Referring again to FIGS. 5 and 6, a bank 360 is formed in the display region on the substrate 300, especially except in the light emitting region. The bank region separates the display region from the non-display region. A light emitting layer 355 is positioned on the anode 350. The light emitting layer 355 may emit red (R), green (G), and blue (B) light, and may be made of an organic material, including for example a phosphorous material or a fluorescent material. When the light emitting layer 355 emits red light, it comprises a host material containing carbazole biphenyl (CBP) or N,N-dicarbazolyl-3,5-benzene (mCP). Further, the light emitting layer 355 may be formed of a phosphorous material comprising a dopant containing at least one selected from the group consisting of P1QIr (acac)(bis(1-phenylisoquinoline)acetylacetonate iridium), PQIr (acac)(bis(1-phenylquinoline)acetylacetonate iridium), PQIr (tris(1-phenylquinoline)iridium) and PtOEP (octaethylporphyrin platinum) or a fluorescent material containing PBD:Eu (DBM)3(Phen) or Perylene. Other materials may be used. When the light emitting layer 355 emits green light, it comprises a host material containing CBP or mCP. Further, the light emitting layer 355 may be formed of a phosphorous material comprising a dopant containing Ir (ppy)3(fac tris(2-phenylpyridine)iridium) or a fluorescent material containing Alq3(tris(8-hydroxyquinolino) aluminum). Other materials may be used. When the light emitting layer 355 emits blue light, it comprises a host material containing CBP or mCP. Further, the light emitting layer 355 may be formed of a phosphorous material comprising a dopant containing (4,6-F2 ppy)2Irpic or a fluorescent material containing any one selected from the group consisting of spiro-DPVBi, spiro-6P, distyryl-benzene (DSB), distyryl-arylene (DSA), PFO-based polymer, PPV-based polymer and a combination thereof. Other materials may be used.

The cathode 370 is positioned on the bank layer 360 comprising the light emitting layer 355. The cathode 370 may be a cathode electrode and may be made of magnesium (Mg), calcium (Ca), aluminum (Al), silver (Ag), or an alloy of them having a low work function. The cathode 370 is connected to the first conductive pattern 351 through via holes in the bank layer 360.

A first passivation film 380 is formed on the entire surface of the substrate 300 where the above-mentioned organic light emitting diode 260 is formed, an organic film layer 383 is formed to fill the underlying stepped portion, and a second passivation film 385 is formed to cover the top of the organic film layer 383. The first passivation film 380, the organic film layer 383, and the second passivation film 385 act as a barrier for protecting the elements including the organic light emitting diode 260 formed on the substrate 300 from external impact and preventing the permeation of moisture and oxygen from the outside.

An additional benefit of the first passivation film 380 is that it fills the gap between the separated first 351 and second 352 conductive patterns, thereby preventing any moisture that has permeated through the APC of the second conductive pattern 352 from permeating any further into the first conductive pattern 351. Further, any leftover bank layer that happens to be deposited in the gap is inconsequential, as the first passivation film 380 fills the remainder of the gap between patterns 351 and 352, thereby preventing moisture permeation.

Moreover, the barrier film 397 is attached above the substrate 300 where the second passivation film 385 is formed, with the sealing material 395 interposed between them. More particularly, the barrier film 397 is prepared, and then the sealing material 395 is applied to one surface of the barrier film 397 and attached above the substrate 300. Here, the sealing material 395 may be a face seal that is applied to the overall surface of the substrate 300 and has high transmission and adhesion properties. Further, the barrier film 397 may be formed using a material with high transmission properties, for example, polyethylene terephthalate (PET) or polycarbonate (PC).

Preferably, the substrate 300 and the barrier film 397 are completely sealed and attached by means of the sealing material 395 interposed between them. The ground line 270 is sealed by the first passivation film 380 and the second passivation film 385. By doing so, the organic light emitting diode display device is manufactured as a stack structure of the switching and driving TFTs 230 and 240, the organic light emitting diode 260, and the barrier film 397 using the sealing material 395.

As described above, the organic light emitting diode display device according to the exemplary embodiment prevents application defects, gaps, and/or blotches caused by the low contact force between subsequently applied organic substances by covering the ground line with conductive patterns.

In addition, the path of moisture permeation through an APC-containing conductive pattern due to Ag corrosion can be blocked, thereby preventing defects in the elements in the display region due to moisture permeation.

Although embodiments have been described with reference to a number of illustrative embodiments thereof, it should be understood that numerous other modifications and embodiments can be devised by those skilled in the art that will fall within the scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

What is claimed is:

1. An organic light emitting diode display device comprising:
    a substrate comprising a display region and a non-display region;
    a thin film transistor in the display region;
    an organic light emitting layer connected to the thin film transistor;
    a bank to define a light emitting region of the organic light emitting layer;
    a metal pattern disposed in the non-display region, more than half of the metal pattern not covered with the bank;
    a first conductive pattern in the display region and the non-display region, at least a portion of the first conductive pattern to extend laterally underneath the bank layer, the first conductive pattern connected to the organic light emitting layer and a top surface of the metal pattern;
    a second conductive pattern in the non-display region, the second conductive pattern connected to the top surface of the metal pattern and physically separated from the first conductive pattern along the top surface of the metal pattern by an opening filled with a passivation film,
    an anode under the organic light emitting layer in the display region; and
    a cathode above the organic light emitting layer in the display region, the cathode electrically connected to the first conductive pattern.

2. The organic light emitting diode display device of claim 1, wherein the metal pattern is a ground line that is formed in the non-display region along the outer periphery of the display region.

3. The organic light emitting diode display device of claim 1, wherein the metal pattern comprises:
    a first metal pattern made of a gate metal comprising a gate electrode of the thin film transistor; and
    a second metal pattern made of a source metal comprising a source electrode of the thin film transistor.

4. The organic light emitting diode display device of claim 3, wherein the first metal pattern and the second metal pattern are electrically connected to each other.

5. The organic light emitting diode display device of claim 1, wherein the second conductive pattern comprises a plurality of parts physically separated from each other.

6. The organic light emitting diode display device of claim 5, wherein the plurality of parts are in the shape of islands or stripes.

7. The organic light emitting diode display device of claim 1, wherein the second conductive pattern comprises a plurality of openings that expose the metal pattern, the openings filled with the passivation film.

8. An organic light emitting diode display device comprising:
    a substrate comprising a display region and a non-display region;
    a thin film transistor in the display region;
    an organic light emitting layer connected to the thin film transistor;
    a bank to define a light emitting region of the organic light emitting layer;
    a metal pattern disposed in the non-display region and not covered with the bank;
    a first conductive pattern connected to the organic light emitting layer and the metal pattern;
    a second conductive pattern connected to the metal pattern and physically separated from the first conductive pattern,
    an anode under the organic light emitting layer; and
    a cathode above the organic light emitting layer, the cathode connected to the first conductive pattern,
    wherein the first and second conductive patterns are made of the same material layer as the anode and has a same stack structure as the anode.

9. An organic light emitting diode (OLED) device comprising:
    a substrate comprising a display region and a non-display region;
    a thin film transistor;
    an anode disposed in the display region and connected to the thin film transistor;
    an organic light emitting layer disposed on the anode in the display region;
    a cathode disposed on the organic light emitting layer in the display region;
    a bank disposed in the display region and separating the organic light emitting layer from the non-display region;
    a ground line disposed in the non-display region, more than half of the ground line not covered with the bank;
    a first conductive pattern in the display region and the non-display region, the first conductive pattern connected to the bank, the cathode, and a top surface of the ground line; and
    a second conductive pattern disposed in the non-display region and connected to the top surface of the ground line, the second conductive pattern physically separated from the first conductive pattern along the top surface of the ground line by an opening filled with a passivation film.

10. The OLED device of claim 9, wherein the first conductive pattern and the second conductive pattern are formed of a same material or same materials.

11. The OLED device of claim 9, wherein the first conductive pattern and the second conductive pattern are formed in a tri-layer structure.

12. The OLED device of claim 9, wherein the anode, first conductive pattern, and second conductive pattern are formed of a same material or materials.

13. The OLED device of claim 9,
    wherein the second conductive pattern comprises a plurality of openings that expose the ground line, the openings filled with the passivation film.

14. The OLED device of claim 9, wherein the ground line comprises:
    a gate ground line made of a same material as a gate electrode of the thin film transistor; and
    a source ground line made of a same material as a source electrode of the thin film transistor.

15. The OLED device of claim 9, wherein the second conductive pattern comprises a plurality of physically separated parts, each of the parts connected to the ground line.

16. The OLED device of claim 15, wherein the plurality of parts are separated by the passivation film.

17. An organic light emitting diode (OLED) device comprising:
- a substrate comprising a display region and a non-display region;
- a thin film transistor;
- an anode disposed in the display region and connected to the thin film transistor;
- an organic light emitting layer disposed on the anode in the display region;
- a cathode disposed on the organic light emitting layer in the display region;
- a bank disposed in the display region and separating the organic light emitting layer from the non-display region;
- a ground line disposed in the non-display region;
- a first conductive pattern connected to the bank, the cathode, and the ground line; and
- a second conductive pattern disposed in the non-display region and connected to the ground line, the second conductive pattern physically separated from the first conductive pattern,
- wherein the first conductive pattern and the second conductive pattern are formed with a layer of Silver alloy between two layers of Indium Tin Oxide.

18. The OLED device of claim 17, wherein the ground line comprises:
- a gate ground line made of a same material as a gate electrode of the thin film transistor; and
- a source ground line made of a same material as a source electrode of the thin film transistor.

19. The OLED device of claim 17, wherein the second conductive pattern comprises a plurality of parts physically separated from each other and the plurality of parts are in the shape of islands or stripes.

20. The OLED device of claim 17, wherein the second conductive pattern comprises a plurality of openings that expose the ground line, the openings filled with a passivation film.

* * * * *